US011638359B2

(12) United States Patent
Lohan et al.

(10) Patent No.: US 11,638,359 B2
(45) Date of Patent: Apr. 25, 2023

(54) LOW PROFILE POWER MODULE PACKAGE

(71) Applicant: Toyota Motor Engineering & Manufacturing North America, Inc., Plano, TX (US)

(72) Inventors: Danny Lohan, Northville, MI (US); Shailesh N. Joshi, Ann Arbor, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 196 days.

(21) Appl. No.: 17/308,565

(22) Filed: May 5, 2021

(65) Prior Publication Data

US 2022/0361353 A1    Nov. 10, 2022

(51) Int. Cl.
| | |
|---|---|
| *H05K 5/02* | (2006.01) |
| *H02M 7/537* | (2006.01) |
| *H01L 23/538* | (2006.01) |
| *H01L 23/532* | (2006.01) |
| *H05K 1/14* | (2006.01) |

(52) U.S. Cl.
CPC ....... *H05K 5/0286* (2013.01); *H01L 23/5385* (2013.01); *H01L 23/5386* (2013.01); *H01L 23/53228* (2013.01); *H02M 7/537* (2013.01); *H05K 1/141* (2013.01)

(58) Field of Classification Search
CPC .................. H05K 5/0286; H05K 1/141; H01L 23/53228; H01L 23/5385; H01L 23/5386; H02M 7/537
USPC ........................................................ 361/737
See application file for complete search history.

(56) References Cited

U.S. PATENT DOCUMENTS

| | | | |
|---|---|---|---|
| 6,822,874 B1 * | 11/2004 | Marler | ................. G02B 6/4452 361/752 |
| 7,893,542 B2 | 2/2011 | Tachibana et al. | |
| 9,362,240 B2 | 6/2016 | Hosseini et al. | |
| 9,379,071 B2 | 6/2016 | Kamphuis et al. | |

(Continued)

FOREIGN PATENT DOCUMENTS

| | | |
|---|---|---|
| CN | 101236959 B | 5/2010 |
| CN | 101604684 B | 2/2012 |

(Continued)

OTHER PUBLICATIONS

T. Modeer, C. B. Barth, N. Pallo, W. H. Chung, T. Foulkes and R. C. N. Pilawa-Podgurski, "Design of a GaN-based, 9-level flying capacitor multilevel inverter with low inductance layout," 2017 IEEE Applied Power Electronics Conference and Exposition (APEC), Tampa, FL, 2017, pp. 2582-2589, doi: 10.1109/APEC.2017.7931062.

(Continued)

*Primary Examiner* — Andargie M Aychillhum
(74) *Attorney, Agent, or Firm* — Snell & Wilmer LLP

(57) ABSTRACT

Methods, systems, and apparatus for a module electronics package. The modular electronics package includes a main circuit. The first main circuit board is configured to provide electrical interconnections to form an electric circuit. The modular electronics package includes a first power module. The first power module includes a first power device card and a first expansion slot. The first power device card is configured to be inserted into the first expansion slot and to be electrically coupled to the main circuit board via the first expansion slot.

14 Claims, 7 Drawing Sheets

(56) References Cited

U.S. PATENT DOCUMENTS

| | | |
|---|---|---|
| 10,283,454 B2 | 5/2019 | Traub et al. |
| 10,770,382 B2 | 9/2020 | Kapusta et al. |
| 2008/0211083 A1 | 9/2008 | Kang et al. |
| 2016/0172284 A1 | 6/2016 | Cho |
| 2017/0187155 A1* | 6/2017 | Jansen ................ H05K 5/0286 |
| 2020/0136611 A1 | 4/2020 | Godfrey |

FOREIGN PATENT DOCUMENTS

| | | |
|---|---|---|
| CN | 207165564 U | 3/2018 |
| TW | I257154 B | 6/2006 |

OTHER PUBLICATIONS

Implementation and switching behavior of a PCB-DBC IGBT module based on the power chip-on-chip 3d concept (https://hal.archives-ouvertes.fr/hal-01373011/document).

* cited by examiner

LOW PROFILE POWER MODULE PACKAGE

BACKGROUND

Field

This disclosure relates to a low profile power module package with modular, removable interchangeable components for an inverter that enables easy assembly and disassembly of power modules in an inverter package of a vehicle.

Description of the Related Art

A power semiconductor module may be used as an inverter within a vehicle to power a motor of the vehicle and/or to power or charge a consumer electronic device coupled to an outlet of the vehicle. Since car batteries and/or fuel cell stacks of a vehicle provide direct current (DC) voltage and the motor of the vehicle and/or a consumer electronic device coupled to the outlet of the vehicle requires alternating current (AC) voltage, the inverter may function by using a unidirectional DC power source to mimic an AC power source to power the motor and/or the coupled consumer electronic device.

Generally, current vehicle inverters used to power the motor of the vehicle are formed from an electronic package that has multiple power modules stacked together to create the inverter. These stacked power modules each include multiple semiconductor devices which are placed on metal lead frames. When one of these stacked power modules fails, the entire electronic package may need to be removed and/or disassembled to replace and/or repair the faulty power module within the electronic package. In another variation, the electronic package that forms the vehicle inverter may consist of a multi-level stacked inverter to increase the total power capability. The entire multi-level stacked inverter, however, would need to be replaced upon failure.

Accordingly, there is a need for a system, apparatus, device and/or method for an improved power module design for easier installation and replacement.

SUMMARY

In general, one aspect of the subject matter described in this disclosure may be embodied in a modular electronics package. The modular electronics package includes a main circuit being configured to provide electrical interconnections to form an electric circuit with an inverter. The modular electronics package includes a first power module. The first power module includes a first power device card and a first expansion slot. The first power device card is configured to be inserted into the first expansion slot and is configured to be electrically coupled to the main circuit board via the first expansion slot.

These and other embodiments may optionally include one or more of the following features. The first power device card may include multiple layers of at least one of a printed circuit board (PCB) or a direct bonded copper (DBC) substrate and one or more power semiconductor devices in between the multiple layers of the at least one of the PCB or the DBC substrate.

The first power device card may be received within the first expansion slot without being soldered, and the first power device card may be removable. The modular electronics package may include a second power module. The second power module may include a second expansion slot. The second power module may include a second power device card. The second power device card may be configured to be inserted into the second expansion slot. The second power device card may be electrically coupled to the main circuit board via the second expansion slot. The second power device card may be interchangeable with the first power device card.

The first power device card may include a first semiconductor device. The second device card may include a second semiconductor device. The first and second semiconductor devices may convert the DC to AC to power a motor. The first power device card may have multiple leads. The multiple leads may include a first lead and a second lead. The multiple semiconductor devices may include a first semiconductor device, a second semiconductor device, and a third semiconductor device. The first semiconductor device and the second semiconductor device may be positioned on the first lead, and the third semiconductor device may be positioned on the second lead.

The first semiconductor device and the second semiconductor device may be positioned adjacent to each other and widthwise along a width of the first lead proximal to a power input to reduce loop inductance. The first power device card may include multiple printed circuit boards interleaved with the one or more power semiconductor devices and one or more wire leads. The multiple printed circuit boards, the one or more power semiconductor devices and the one or more wire leads may be electrically coupled via one or more vias.

In another aspect, the subject matter may be embodied in an electronics package. The electronics package includes a power device card. The power device includes multiple printed circuit boards and multiple semiconductor devices. The electronics package includes an expansion slot configured to receive the power device card. The electronics package includes a main circuit. The main circuit is configured to provide electrical interconnections to form an electric circuit with an inverter of a vehicle.

In another aspect, the subject matter may be embodied in a modular electronics package. The modular electronics package includes a main circuit. The main circuit has a first expansion slot and a second expansion slot. The main circuit is configured to provide electrical interconnections to form an electric circuit. The modular electronics package includes a first power device card. The first power device card is configured to be inserted into the first expansion slot and to be electrically coupled to the main circuit via the first expansion slot. The second power device card is configured to be inserted into the second expansion slot and to be electrically coupled to the main circuit via the second expansion slot. The second power device card is interchangeable with the first power device card.

BRIEF DESCRIPTION OF THE DRAWINGS

Other systems, methods, features, and advantages of the present invention will be apparent to one skilled in the art upon examination of the following figures and detailed description. Component parts shown in the drawings are not necessarily to scale, and may be exaggerated to better illustrate the important features of the present invention.

DETAILED DESCRIPTION

Disclosed herein are systems, devices, apparatuses, platforms and/or methods for an electronics package that connects to an inverter of the vehicle. Particular embodiments of the subject matter described in this disclosure may be implemented to realize one or more of the following advantages. The electronics or inverter package ("or electronics package") assembly is formed from multiple power modules arranged in multiple subassemblies, such as multiple power device cards, that utilize a low-profile design. The power device cards may be connected to an inverter device using a solder-free connection, e.g., the multiple power device cards may be plugged into one or more sockets or receiving or expansion slots that are coupled to or part of the inverter device. The solder-free connection may include a push-type socket that connects the power semiconductor devices with the inverter device. The power device cards may be composed of a multi-layer chip-on-chip structure where multiple power semiconductor devices are positioned in-line with each other and interleaved between conductive layers, such as a DBC substrate or PCB, to facilitate various package connections. By connecting the power devices using a solder-free connection, this allows each power device card or power module to be easily replaced when damaged or otherwise faulty, which reduces the amount of time to assemble and/or disassemble individual components and the entire electronics package. Moreover, the electronics package isolates the power devices in the stack, and so, only a single power device card may need to be replaced upon a failure.

Moreover, since the multiple power device cards are easily removed and/or inserted, the amount of the power that the inverter converts or transforms may be configured. That is, the modular design allows for the power level to be scaled. For example, as more power device cards are added and/or inserted onto the main circuit board, the amount of power that the inverter may convert or transform may increase. And, as power device cards are removed, the amount of power that the inverter may convert or transform may decrease. The power level may also be dependent on the number of power semiconductor devices on each power device card. Additionally, each of these power device cards may be interchangeable with another power device card, and so, the power device cards are standardized, which minimizes manufacturing and installation costs.

Other benefits and advantages include arranging the power device in a lengthwise or widthwise direction on the output busbars to decrease loop inductance. This improves the thermo-electric performance of the electronics package. In particular, a low power loop inductance improves the switching performance of the inverter and increases efficiency.

Figure 1:
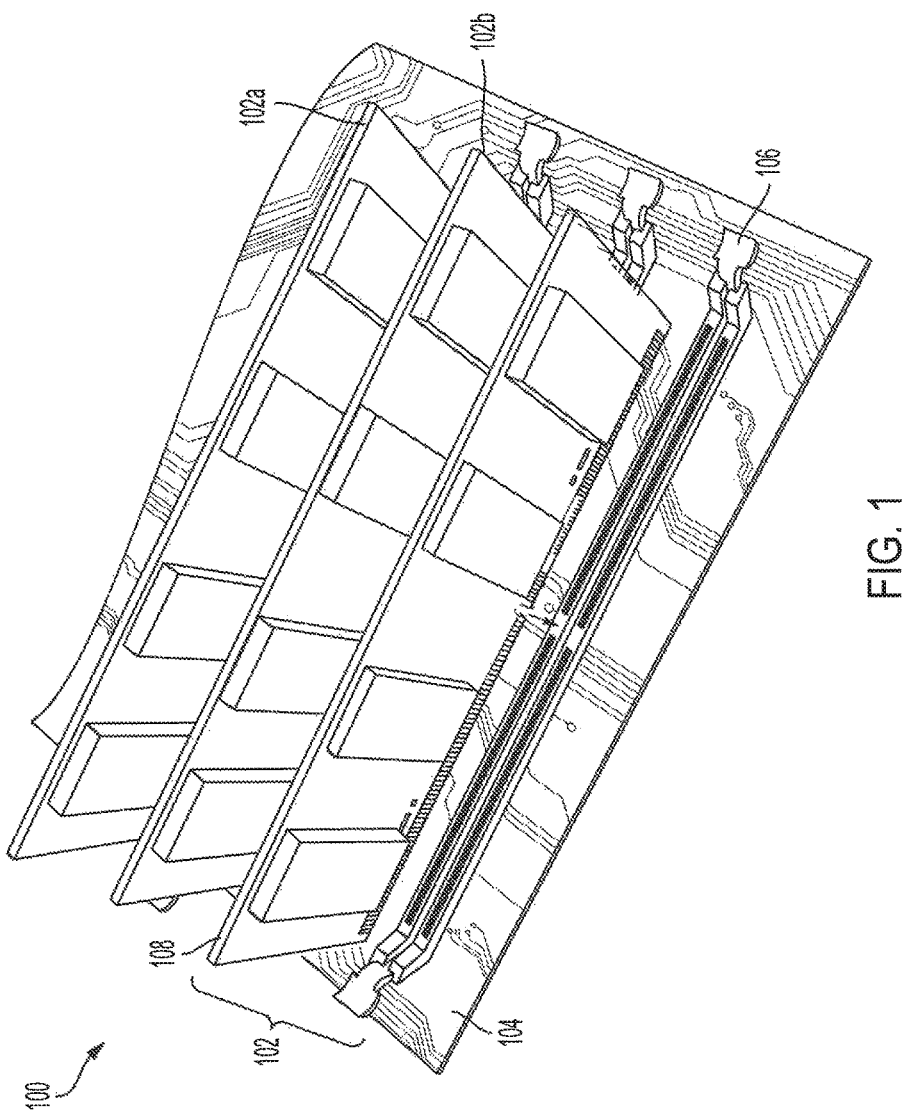
FIG. 1 shows an example electronics package of an inverter of a vehicle according to an aspect of the invention.
Figure 2:
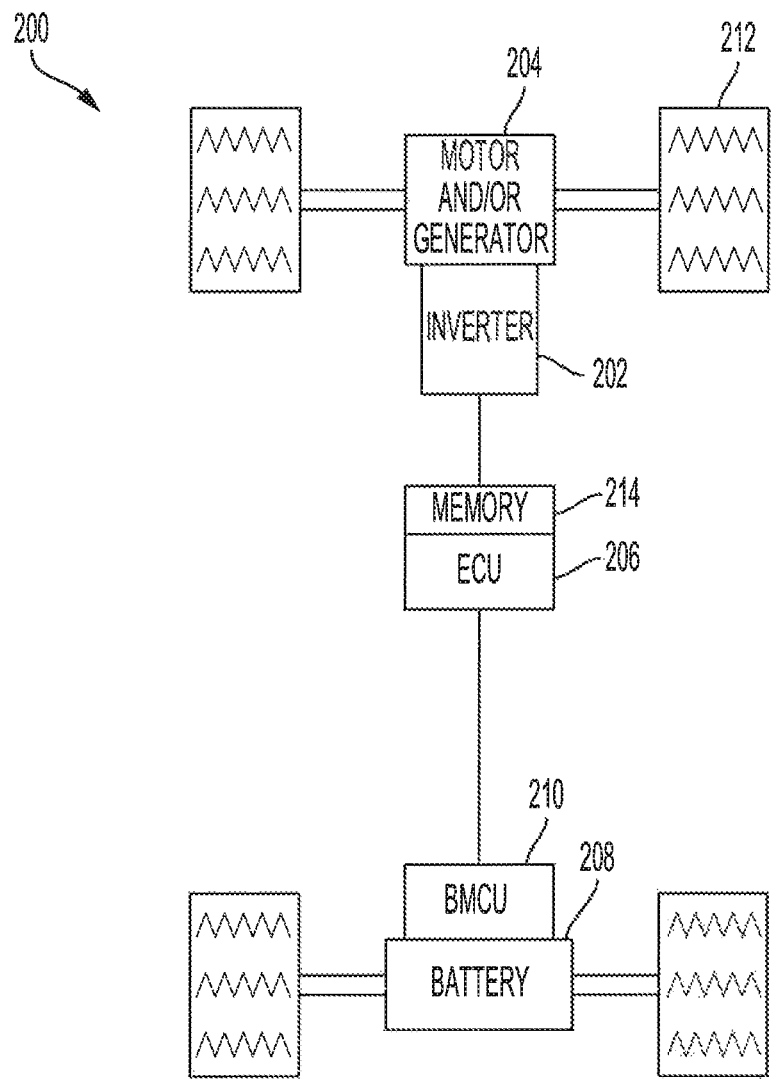
FIG. 2 shows a schematic diagram of the vehicle according to an aspect of the invention.

FIG. 1 shows a modular electronics package (or "electronics package") 100. The electronics package 100 may be assembled and used as an inverter package to convert alternating current (AC) to direct current (DC) or DC to AC within a vehicle 200. For example, the electronics package 100 may be used as or coupled to a remainder of the inverter 202, as shown in FIG. 2 for example. The modular electronics package 100 may be assembled and used in various other applications in addition to the inverter package of the vehicle 200. For example, the modular electronics package 100 may be used in computer power supplies, data centers, power plants and other stationary applications.

The electronics package 100 includes one or more power modules 102 and/or a main circuit board 104 for an inverter device. The one or more power modules 102 may include a first power module 102a, a second power module 102b and/or any number of power modules. The one or more power modules 102 may include an expansion slot 106 and/or a power device card 108. The power device card 108 may be inserted into the expansion slot 106 to power and connect the power device card 108 and connect the power device card 108 to other power device cards 108 via the main circuit board 104. In some implementations, the expansion slot 106 is part of and/or coupled to the main circuit board 104.

Each of the power modules 102 may have components that are interchangeable with components of the other power modules and may be interconnected with the other power modules. The number of power modules 102 in use may be configurable and correspond to an amount of power that needs to be converted to provide energy to power the motor and/or generator 204 to create engine torque and/or to control the regenerative braking torque to capture energy. For example, the number of power modules 102 in use may be increased to increase the amount of power that is to be converted, and the number of power modules 102 in use may be decreased to decrease the amount of power that is to be converted.

The one or more power modules 102 may each include an expansion slot 106 and a power device card 108. The expansion slot 106 may receive a corresponding power device card 108, and when the corresponding power device card 108 is inserted into the expansion slot 106, the expansion slot 106 electrically couples the corresponding power device card 108 with the main circuit board 104. And so, the different power device cards 108 for the different power modules 102 may be electrically coupled and/or interconnected with the remainder of the inverter and the other power device cards 108 when the different power device cards 108 are inserted into the corresponding expansion slot 106. Moreover, the power device cards 108 for the different power modules 102 may be removed from the corresponding expansion slot 106 when the power device card 108 fails and/or when an operator or other user desires to interchange the power device card 108 with another device card and/or decrease the number of power modules 102 in use by the inverter 202. This allows the operator and/or user to insert, remove and/or interchange different power device cards 108 into their corresponding expansion slot 106 to replace damaged or failed power device cards 108 and/or to adjust the amount of power that the one or more power modules 102 may convert.

The one or more power modules 102 may have and use solder-free connections to couple the power device card 108 and corresponding expansion slot 106 and/or among the one or more power modules 102. For example, the expansion slot 106 may have a solder-free connection, such as a push-type socket, that receives the corresponding power device card 108 and allows the corresponding power device card 108 to be removed, inserted and/or interchanged. This provides the benefit of ease of replacement and/or interchangeability of the one or more power modules 102. Moreover, upon failure of one (or more) of the power modules 102, the entire electronics package 100 does not need to be replaced, and instead, only the failed power module(s) of the one or more power modules 102 would need to be replaced so that the inverter 202 may continue to function. Moreover, one or more redundant power modules 102 may be inserted and/or included in the electronics package 100 so that if one power module 102 fails, the vehicle 200 may continue to operate until the driver is able to reach a dealership or other service center to swap out the broken or failed power module(s).

FIG. 2 shows a schematic diagram of a vehicle 200. A vehicle 200 is a conveyance capable of transporting a person, an object, or a permanently or temporarily affixed apparatus. The vehicle 200 may be a self-propelled wheeled conveyance, such as a car, a sports utility vehicle, a truck, a bus, a van or other motor, battery or fuel cell driven vehicle. For example, the vehicle 200 may be an electric vehicle, a hybrid vehicle, a hydrogen fuel cell vehicle, a plug-in hybrid vehicle or any other type of vehicle that has a fuel cell stack, a motor and/or a generator. Other examples of vehicles include bicycles, trains, planes, or boats, and any other form of conveyance that is capable of transportation. The vehicle 200 may be semi-autonomous or autonomous.

The vehicle 200 may include an inverter 202, a motor and/or generator 204, a battery 208, an electronic control unit 206, a battery management control unit 210, a memory 214 and/or multiple wheels 212. The inverter 202 may be coupled to a motor and/or generator 204 and control the engine torque and/or the regenerative braking torque. The inverter 202 may control the engine torque of the motor and/or generator 204 and convert DC obtained from the battery of the vehicle into AC to power the motor and/or generator 204 and generate engine torque to power or move the wheels of the vehicle 200. In some implementations, the inverter 202 may control the regenerative braking torque of the motor and/or generator 204 and convert AC obtained from the motor and/or generator 204 into DC that is stored in a battery of the vehicle 200.

The vehicle 200 may include an electronic control unit (ECU) 206. The ECU 206 may be implemented as a single ECU or as multiple ECUs. The ECU 206 may be electrically coupled to some or all of the other components within the vehicle 200, such as the motor and/or generator 204, the engine (not shown), the battery 208, the inverter 202, the battery management control unit (BMCU) 210, the memory 214 and/or the multiple wheels 212. The ECU 206 may include one or more processors or controllers specifically designed for controlling the inverter 202 and/or power generation and/or delivery within the vehicle 200. The ECU 206 may be coupled to the memory 214.

The memory 214 may be coupled to the ECU 206 and store instructions that the ECU 206 executes. The memory 214 may include one or more of a Random Access Memory (RAM) or other volatile or non-volatile memory. The memory 214 may be a non-transitory memory or a data storage device, such as a hard disk drive, a solid-state disk drive, a hybrid disk drive, or other appropriate data storage, and may further store machine-readable instructions, which may be loaded and executed by the ECU 206 or other processor.

The motor and/or generator 204 may convert electrical energy into mechanical power, such as torque, and may convert mechanical power into electrical energy, such as via regenerative braking. The motor and/or generator 204 may be coupled to the battery 208 via the inverter 202. The motor and/or generator 204 may convert the energy from the battery 208 into mechanical power, and may provide energy back to the battery 208, for example via regenerative braking. The inverter 202 may convert direct current (DC) from the battery 120 into alternative current (AC) for the motor and/or generator 118 to power or move the wheels 212 of the vehicle 200. The inverter 202 may convert the AC from the motor and/or generator 204 and that is produced via regenerative braking to DC to store in the battery 208. The wheels 212 of the vehicle 200 may create torque to move the motor and/or generator 204 to provide the AC to the inverter 202 to convert into DC to be stored in the battery 208, e.g., when coasting or decelerating. The inverter 202 may control the regenerative braking torque of the electric motor that decelerates the vehicle 200.

The battery 208 may be coupled to the motor and/or generator 204 and may provide electrical energy to and receive electrical energy from the motor and/or generator 204. The battery 208 may include one or more rechargeable batteries.

The BMCU 210 may be coupled to the battery 208 and may control and manage the charging and discharging of the battery 208. The BMCU 210, for example, may measure, using battery sensors, parameters used to determine the state of charge (SOC) of the battery 208. The BMCU 210 may control the battery 208 to maintain a reserve power explicitly for providing a sudden burst of electrical energy to be converted into power for the transmission to drive or move the multiple wheels of the vehicle 200.

The inverter 202 may be coupled to the electronic package 100, and in particular, couple to the power module 102 of the electronic package 100 to convert power AC to DC and DC to AC within the vehicle 200. The power module 102 may have a power device card 108 that is composed of multiple power semiconductor devices 308 positioned in-line with each other and sandwiched and/or interleaved in between multiple conductive layers. The multiple conductive layers extend from the power device card 108 to form a trilateral in-line connection that may be selectively connected to a trilateral in-line expansion slot 106 of the main circuit board 104 of an inverter device 202. The multiple conductive layers may be formed from layers of a power electronic substrate or printed circuit boards. The power device card 108 may connect to the main circuit board 104 or remainder of the inverter 202 via a solder-free connection, such as the expansion slot 106.

Figure 3A:
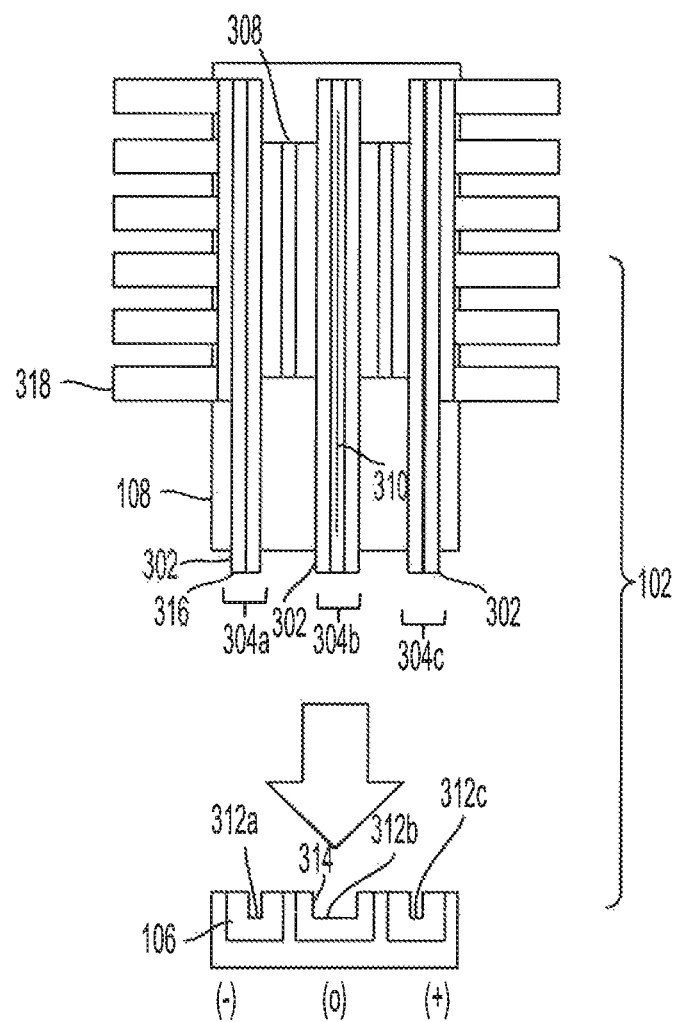
FIG. 3A shows an example power module of the electronics package of FIG. 1 having power semiconductor devices interleaved between layers of a Direct Bonded Copper (DBC) substrate according to an aspect of the invention.
Figure 4A:
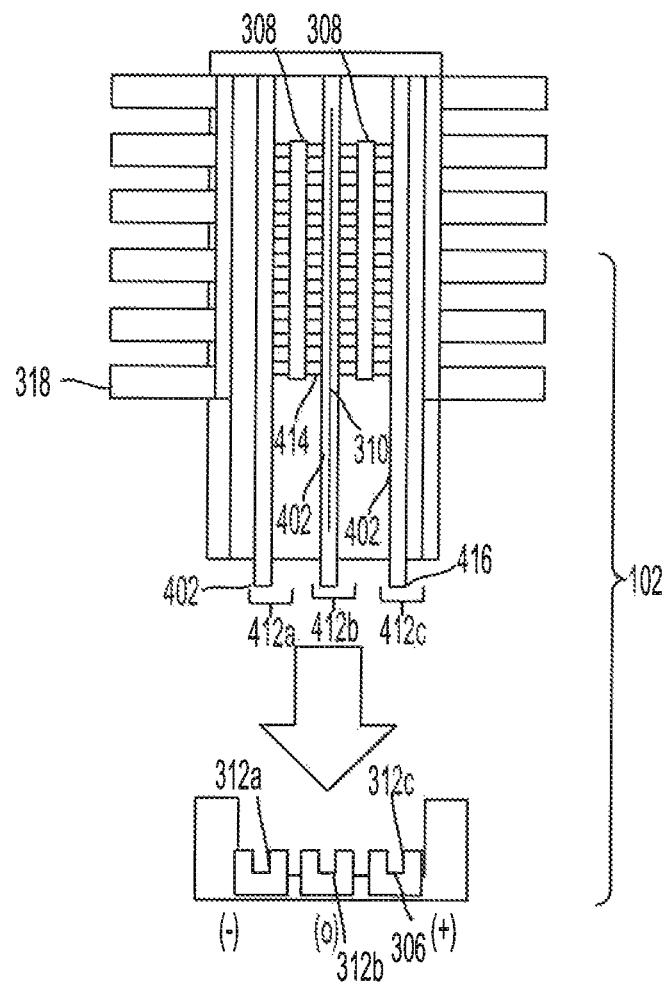
FIG. 4A shows an example power module of the electronics package of FIG. 1 having power semiconductor devices interleaved between Printed Circuit Board (PCB) layers according to an aspect of the invention.

FIGS. 3A and 4A show side-perspective views of different implementations of the power module 102 of the electronics package 100. FIG. 3A shows the power module 102 of the electronics package 100 having power semiconductor devices 308 interleaved between layers of a power electronic substrate, such as a DBC substrate 302. FIG. 4A shows the power module 102 of the electronics package 100 having power semiconductor devices 308 interleaved between layers of the PCB 402.

In FIG. 3A, the power module 102 may have a power device card 108 that is coupled to the main circuit board 104 by connecting to the expansion slot 106. The power device card 108 may be formed from multiple conductive layers, one or more wire leads 310 and/or one or more power semiconductor devices 308 and/or a heat sink 318. The heat sink 318 may be coupled to one or more of the multiple conductive layers to dissipate heat.

The multiple conductive layers may include multiple layers of a power electronic substrate, such as the DBC substrate 302. The power electronic substrate may interconnect the power semiconductor devices 308 positioned on the different layers of the power electronic substrate. The multiple layers of the power electronic substrate may provide interconnections among the one or more power semiconductor devices 308 so that power that is provided from the negative terminal of the main circuit board 104 may traverse through the power semiconductor devices 308 to the positive terminal of the main circuit board 104.

The one or more power semiconductor devices 308 may be used to perform the switching that the inverter 202 requires to alternate the direction of the DC to produce AC or vice versa. The one or more power semiconductor devices 308 may be positioned in-line with each other and interleaved between two or more layers of the power electronics substrate, such as between the first DBC substrate layer 304a and the second DBC substrate layer 304b and/or in between the second DBC substrate layer 304b and the third DBC substrate layer 304c.

Each layer extends from the power module 102 to form a trilateral in-line connection that may be selectively connected to a trilateral in-line receiving slot of the expansion slot 106. The in-line arrangement allows for a modular low profile design and allows for scalability of the power level with the removal or introduction of a power module 102 into the electronics package 100. Moreover, the in-line arrangement minimizes a wire length or path from the power semiconductor devices to the output.

Figure 5A:
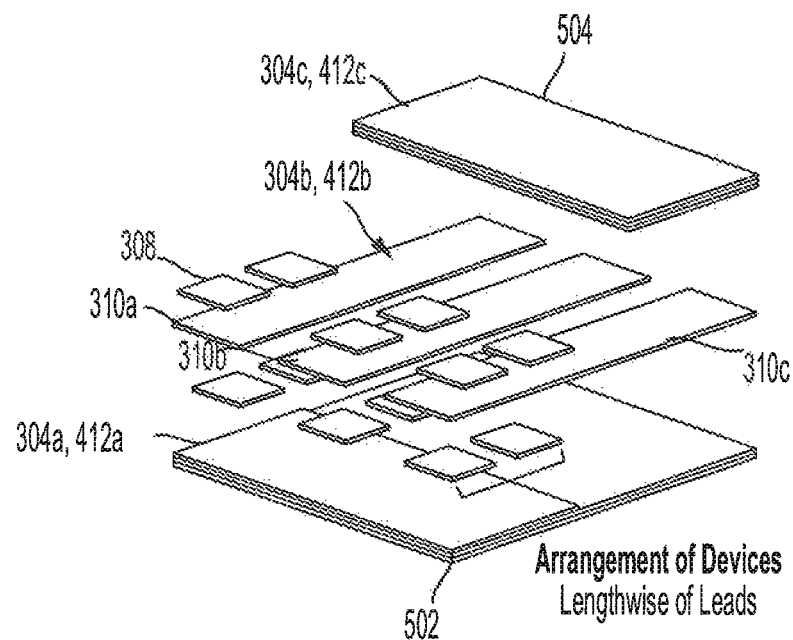
FIG. 5A shows a lengthwise arrangement of the power module of the electronics package of FIG. 1 according to an aspect of the invention.
Figure 5B:
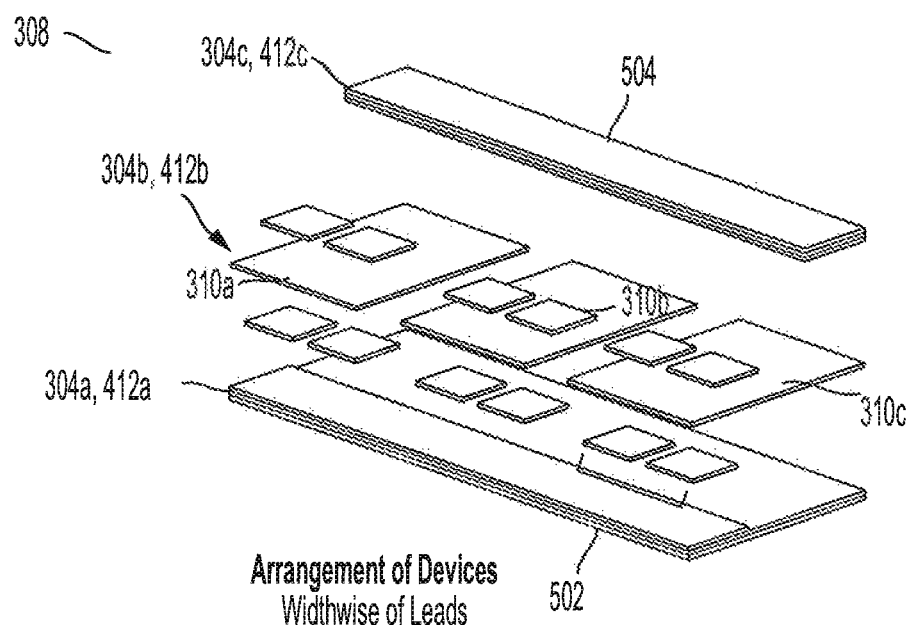
FIG. 5B shows a widthwise arrangement of the power module of the electronics package of FIG. 1 according to an aspect of the invention.

The multiple layers of the power electronic substrate may include a first DBC substrate layer 304a, a second DBC substrate layer 304b and a third DBC substrate layer 304c. The second DBC substrate layer 304b may be positioned in between the first DBC substrate layer 304a and the third DBC substrate layer 304c. The second DBC substrate layer 304b may be coupled to or include one or more wire leads 310. The one or more wire leads 310 may include one or more U, V, W leads. The one or more power semiconductor devices 308 may be arranged in either a lengthwise or widthwise arrangement along the one or more DBC substrate layers or PCB layers and/or the one or more wire leads 310, as shown in FIGS. 5A and 5B and as described below, for example.

The ends of the DBC substrate layers 304a-c may be inserted into an expansion slot 106. For example the first DBC substrate layer 304a may be inserted into a receiving slot 312a of the expansion slot 106 to connect to the negative terminal of the main circuit board 104, the second DBC substrate layer 304b may be inserted into a receiving slot 312b of the expansion slot 106 and the third DBC substrate layer 304c may be inserted into the receiving slot 312c of the expansion slot 106 to connect to the positive terminal of the main circuit board 104.

The one or more power semiconductor devices 308 may be a metal-oxide-semiconductor field-effect transistor (MOSFET), insulated-gate bipolar transistor (IGBT), bipolar junction transistor (BJT) or other transistor or diode. The one or more power semiconductor devices 308 may be interleaved between the multiple conductive layers of the power electronic substrate.

The expansion slot 106 may be embedded, coupled to, recessed within or positioned on the main circuit board 304 of the inverter device 202. The expansion slot 106 may have multiple receiving slots 312a-c that may be composed of an in-line longitudinal channel that extends a length of the power device card 108 and may have one or more electrically conductive pins or sockets 314 within. The multiple receiving slots 312a-c may include a first receiving slot 312a, a second receiving slot 312b and a third receiving slot 312c. The first receiving slot 312a may be a negative terminal (−). The second receiving slot 312b may be an AC output terminal (o) that leads to the motor and/or generator 204 via one or more electrical traces, such as signal or circuit board connections, and the third receiving slot 312c may be a positive terminal (+). Power may flow from the negative terminal through the multiple layers of the chip-on-chip structure of the power device card 108 including the one or more semiconductor devices 308 within the multiple layers of the power device card 108 to the positive terminal when the battery 208 discharges electrical energy through the inverter 202 to power the motor and/or generator 204 and move the wheels 212 of the vehicle 200. The one or more power semiconductor device 308 may convert the DC of the battery 208 into AC for the motor and/or generator 204 to move the wheels 212.

When the vehicle 200 is generating electrical energy via regenerative braking, the electrical energy that is generated by the motor and/or generator 204 may be passed from the positive terminal through the multiple layers of the chip-on-chip structure of the power device card 108 to the negative terminal to be stored in the battery 208. The one or more power semiconductor devices 308 may convert the AC generated by the motor and/or generator 204 into DC to be stored in the battery 208.

The one or more electrically conductive pins or sockets 314 may connect to one or more conductive pins or sockets 316 and/or to the edge of the one or more DBC substrate layers 304a-c on a bottom edge of the power device card 108 to electrically connect the power device card 108 with the receiving slots 312a-c via a solder-free connection. The one or more electrically conductive pins or sockets 314 may be a push-type socket, which allows for a solder-free connection and allows the power device card 108 to be easily removed from the expansion slot 106. The push-type socket may be a dual in-line slot that allows for easy install and replaceability of the one or more power modules 102.

The one or more pins or sockets 316 and/or edges of the one or more DBC substrate layers 304a-c on the bottom edge of the power device card 108 may be inserted into the one or more electrically conductive pins or sockets 314 of the receiving slots 312a-c to electrically couple the power device card 108 with the main circuit board 104. A user or other operator may align the bottom edge of the power device card 108 with the expansion slot 106 and push or insert the power device card 108 into the expansion slot 106. When the bottom edge of the power device card 108 is inserted into one of the receiving slots 312a-c, the electrically conductive pins or sockets 314 may expand outward to receive the bottom edge of the power device card 108 and compress inward to hold and secure the power device card 108 within the receiving slot 312a-c. In some implementations, the edge of the power device card 108 may use a conducive bar or strip, such as a metal bar, to be inserted into and electrically couple with the receiving slot 312a-c.

This facilitates the easy replacement and removal of a single power module 102 within the electronics package 100 for the inverter 202 when a power semiconductor device 308 has been damaged or otherwise needs to be replaced. And so, an operator need not remove and/or replace the entire electronics package 100 when a single power semiconductor device 308 is damaged or otherwise needs to be replaced. This improves upon a stacked multi-level inverter by specifically isolating the one or more power semiconductor devices in the stack into one or more power modules 102 that are selectively removable from the inverter 202.

In another aspect of the electronics package 100, the power module 102 may have a different chip-on-chip structure. FIG. 4A shows the power module 102 of the electronics package 100 having power semiconductor devices 308 interleaved between layers of PCBs 402, which may function similar to a power electronic substrate and provide interconnections between the power semiconductor devices 308. The power module 102 whether interleaved using PCBs 402 or DBC substrates 302 may have the same, similar or different components but have the same or different chip-on-chip structure.

The power module 102 may similarly include the power device card 108, the expansion slot 106, one or more power semiconductor devices 308, one or more wire leads 310 and/or the heat sink 318. These components may perform the same or similar functionality regardless of the use of the PCB 402 or DBC substrate 302 to provide the interconnections. The power module 102 that uses the printed circuit board 402, however, may be arranged or layered differently than the power module 102 that uses the DBC substrate 302.

The electronics package 100 may have one or more power semiconductor devices 308, such as multiple power semiconductor device 308, that may be integrated or embedded within or coupled to the one or more PCBs 402 to form the power device card 108 that fits into the expansion slot 106 via a solder-free connection. The one or more power semiconductor devices 308 may be used to perform the switching that the inverter 202 requires to alternate the direction of the DC to produce AC or vice versa.

For example, the power device card 108 may have a first PCB layer 412a, a second PCB layer 412b and a third PCB layer 412c. The second PCB layer 412b may be positioned in between the first PCB layer 412a and the third PCB layer 412c. The power device card 108 may also have one or more vias 414 that electrically connect each of the one or more PCB layers 412a-c. The first PCB layer 412a may align and be inserted and received within the first receiving slot 312a. The first set of one or more power semiconductor devices 308 may be positioned on, embedded or integrated with or otherwise coupled to the first PCB layer 412a and in between the first PCB layer 412a and the second PCB layer 412b. The second PCB layer 412b may be positioned in between the first PCB layer 412a and the third PCB layer 412c. The second layer 412b may align and be inserted and received within the second receiving slot 312b. The second PCB layer 412b layer may include or be coupled to the one or more wire leads 310 and include or be coupled to a second set of one or more power semiconductor devices 308 positioned on, embedded or integrated with or otherwise coupled to the second PCB layer 412b. The second set of the one or more power semiconductor devices 308 may be positioned in between the second PCB layer 412b and the third PCB layer 412c. The second layer 412b and the second set of the one or more power semiconductor devices 308 may be electrically connected via the one or more vias 414. The third PCB layer 412c may align and be inserted and received within the third receiving slot 312c. As discussed above, each of the one or more receiving slots 312a-c function as a terminal of the power module 102.

The expansion slot 106 may be embedded, coupled to, recessed within or positioned on top of the main circuit board 104 of the inverter device. The expansion slot 106 may include multiple receiving slots 312a-c that may be composed of an in-line longitudinal channel that extends a length of the power device card 108 and may have one or more electrically conductive pins or sockets 314 within, as discussed above.

The one or more electrically conductive pins or sockets 314 or other connection on the substrate or printed circuit board may connect to a bottom edge of the one or more PCB layers 412a-c. The bottom edge of the one or more PCB layers 412a-c may have a conductive bar 416 or another set of one or more conductive pins or sockets that are to be inserted into and electrically couple with the receiving slot 312a-c. A user or other operator may align the bottom edge of the power device card 108 with the expansion slot 106 and push or insert the power device card 108 into the expansion slot 106.

Figure 3B:
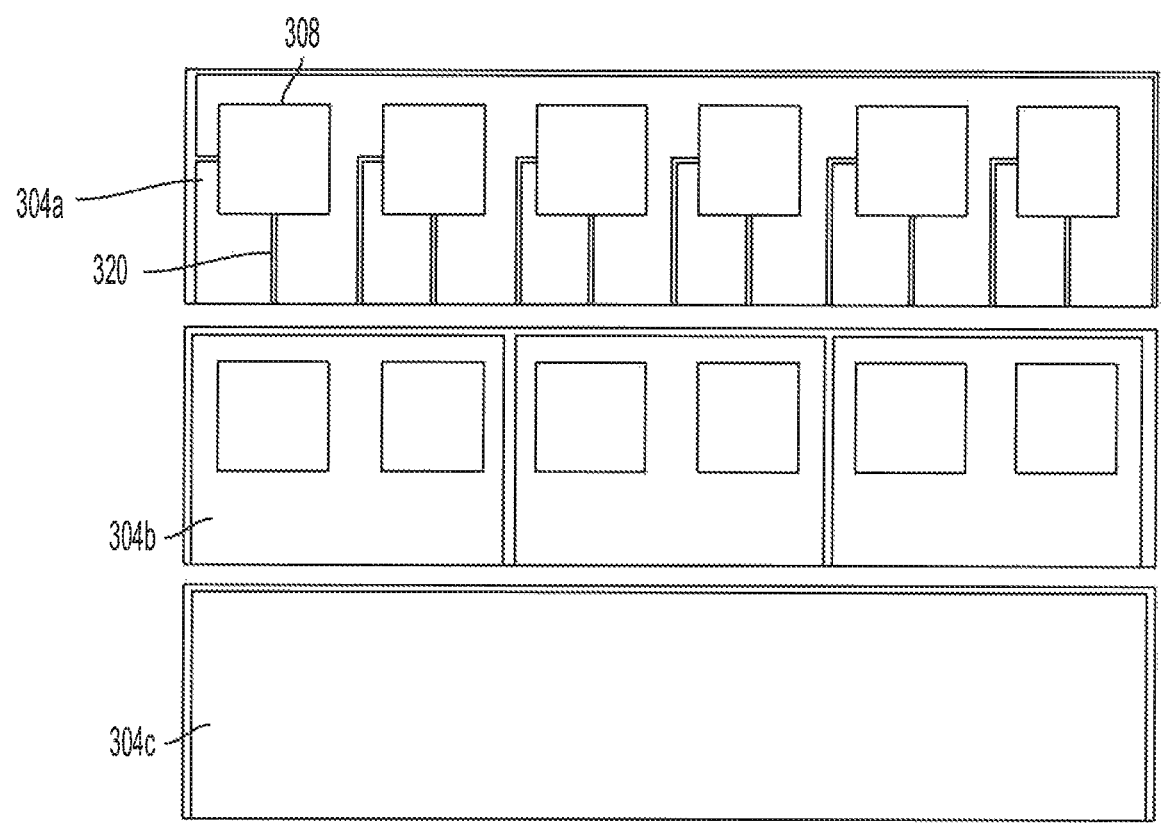
FIG. 3B shows the power module of FIG. 3A with the one or more layers of the DBC substrate having the one or more power semiconductor devices according to an aspect of the invention.
Figure 4B:
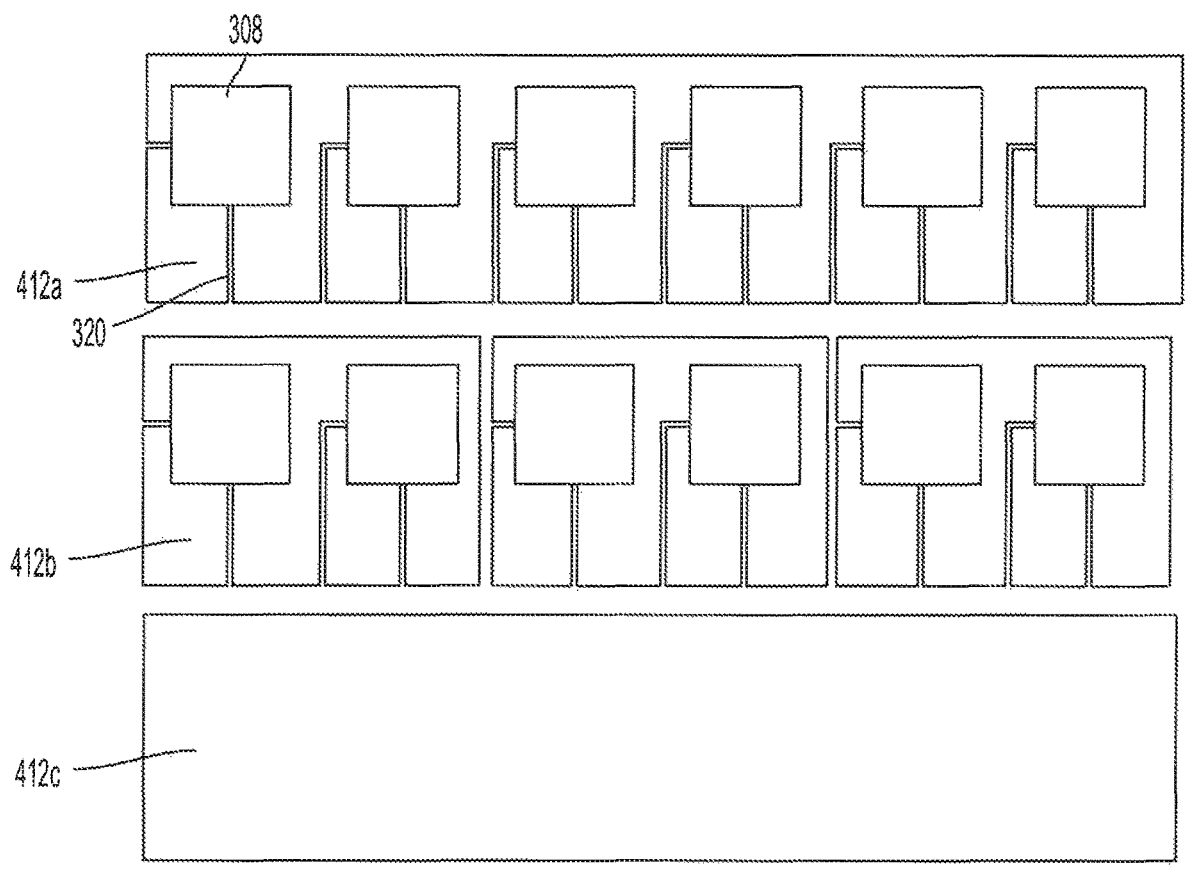
FIG. 4B shows the power module of FIG. 4A with the one or more PCB layers having the one or more power semiconductor devices according to an aspect of the invention.

FIGS. 3B and 4B show the different layers of the power module 102. The one or more power semiconductor devices 308 may be positioned on the one or more layers of the power electronics substrate, such as on the DBC substrate 302, as shown in FIG. 3B, or on the PCB 402, as shown in FIG. 4B, for example. One or more electrical traces 320 on the DBC substrate 302 or the PCB 402 provide the signal and/or power to each of the one or more power semiconductor devices 308. The power semiconductor devices 308 may be positioned either in a lengthwise direction along a length, as shown in FIG. 5A for example, or in a widthwise direction along a width, as shown in FIG. 5B for example. Any number of the power semiconductor devices 308 may be positioned on the one or more DBC substrate layers or PCB layers. The different arrangements of the lengthwise or widthwise arrangements are further described below in reference to FIGS. 5A and 5B. The different arrangement of the power semiconductor devices 308 offer numerous advantages. For example, the widthwise arrangement provides lower power loop inductance, which improves the switching performance of the inverter 202 to increase efficiency.

FIGS. 5A and 5B show multiple layers within the power module 102 of the electronics package 100. The power module 102 of the electronics package 100 has multiple conductive layers of the DBC substrate or PCB. The multiple layers may include a top layer, which leads to the capacitor and may include a positive terminal 504, a middle layer that is in between the top layer and the bottom layer and that may include the one or more wire leads 310, such as the first wire lead 310a, the second wire lead 310b and the third wire lead 310c, which may be U, V and W leads, respectively. The bottom layer may also lead to the capacitor and include the negative terminal 502 of the main circuit board 104. One or more layers of the one or more power semiconductor devices 308 may be positioned in between the middle layer and the top layer, and in between the middle layer and the bottom layer. The bottom layer may be the first DBC substrate layer 304a or the first PCB layer 412a. The middle layer may be the second DBC substrate layer 304b or the second PCB layer 412b. The top layer may be the third DBC substrate layer 304c or the third PCB layer 412c.

FIG. 5A shows a narrower elongated electronics package 100 that has a lengthwise arrangement of the one or more power semiconductor devices 308 on the one or more wire leads 310. In FIG. 5A, the one or more wire leads 310 extend along a longitudinal length of the power device card 108 from a proximal end of the power module 102 to a distal end of the power module 102. The proximal end may be defined as the end closest to the negative terminal 502 of the main circuit board 104, and the distal end may be defined as the end furthest from the negative terminal 502 and closest to the positive terminal 504 of the main circuit board 104. The one or more power semiconductor devices 308 may be arranged along the longitudinal length of the one or more wire leads 310. For example, the one or more semiconductor devices 308 may be arranged along the longitudinal length in a single column and in multiple rows where each row is arranged in a proximal to distal direction. The lengthwise arrangement of the one or more power semiconductor devices 308 causes a longer wire length or path than the widthwise arrangement of the one or more power semiconductor devices 308, which may result in a larger loop inductance. The larger loop inductance, however, allows for a larger maximum junction temperature because maximum junction temperature is inversely proportional to the loop inductance, as shown in FIG. 6 for example.

FIG. 5B shows a wider electronics package 100 having a widthwise arrangement of the one or more power semiconductor devices 308 on the one or more wire leads 310. In FIG. 5B, the one or more wire leads 310 extend along a width of the power module of the electronics package 100. For example, the one or more power semiconductor devices 308 may be arranged along the width in multiple columns and in a single row where the row is approximately equidistant between the proximal end and the distal end of the one or more wire leads 310a so that the wire length or path is minimized between the negative terminal 502 and the positive terminal 504. Each of the one or more power semiconductor devices 308 may be positioned equidistant between the negative terminal 502 and the positive terminal 504. This reduces the number of rows of power semiconductor devices 308 and the overall length of the one or more wire leads 310 from the negative terminal 502 to the positive terminal 504. The overall length in a widthwise arrangement is less than in a lengthwise arrangement having the same number of power semiconductor devices 308. Each column of the multiple columns may be positioned equidistant from each other and equidistant between the negative terminal 502 and the positive terminal 504. The different layers of the power semiconductor devices 308 may be stacked on top of each other with the one or more wire leads 310 in between. The widthwise arrangement of the one or more power semiconductor devices 308 results in a shorter wire length or path from the negative terminal 502 to the positive terminal 504 through the one or more power semiconductor devices 308 than the lengthwise arrangement of the one or more power semiconductor devices 308. This may result in a smaller loop inductance, which improves the signal quality and reduces overshooting and/or ringing in the signal. The lengthwise arrangement may perform better from a mechanical stress perspective, while the widthwise arrangement may perform better from an inductance perspective.

Since the wire length or path is minimized, the amount of inductance or the inductance loop is reduced, which improves signal quality because the amount of inductance is correlated with the wire length or path. As the wire length or path increases, the amount of inductance increases, which reduces signal quality, e.g., due to overshooting and/or ringing, and increases signal loss, and as the wire length or path decreases, the amount of inductance decreases, which improves signal quality, e.g., due to overshooting and/or ringing, and reduces signal loss.

Exemplary embodiments of the invention have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A modular electronics package, comprising: a main circuit being configured to provide electrical interconnections to form an electric circuit with a power inverter; and a first power module including a first power device card and a first expansion slot, the first power device card being configured to be inserted into the first expansion slot and to be electrically coupled to the main circuit board via the first expansion slot, wherein the first power device card has a plurality of leads including a first lead and a second lead and a plurality of semiconductor devices including a first semiconductor device, a second semiconductor device, and a third semiconductor device, wherein the first semiconductor device and the second semiconductor device are positioned on the first lead and the third semiconductor device is positioned on the second lead, wherein the first semiconductor device and the second semiconductor device are positioned adjacent to each other and widthwise along a width of the first lead proximal to a power input to reduce loop inductance.

2. The modular electronics package of claim 1, wherein the first power device card includes a plurality of layers of at least one of a printed circuit board (PCB) or a direct bonded copper substrate (DBC) and one or more power semiconductor devices in between the plurality of layers of the at least one of the PCB or the DBC.

3. The modular electronics package of claim 1, wherein the first power device card is received within the first expansion slot without being soldered and the first power device card is removable.

4. The modular electronics package of claim 1, further comprising:
a second power module having:
a second expansion slot; and
a second power device card being configured to be inserted into the second expansion slot and to be electrically coupled to the main circuit board via the second expansion slot, wherein the second power device card is interchangeable with the first power device card.

5. The modular electronics package of claim 4, wherein the first power device card includes a first semiconductor device and the second device card includes a second semiconductor device, wherein the first and second semiconductor devices convert direct current (DC) to alternating current (AC) to power a motor.

6. The modular electronics package of claim 1, wherein the first power device card includes a plurality of printed circuit boards (PCB) interleaved with one or more power semiconductor devices and one or more wire leads, wherein the plurality of printed circuit boards, the one or more power semiconductor devices and the one or more wire leads are electrically coupled via one or more vias.

7. An electronics package, comprising: a power device card including a plurality of printed circuit boards and a plurality of semiconductor devices; an expansion slot configured to receive the first power device card; and a main circuit being configured to provide electrical interconnections to form an electric circuit with an inverter of a vehicle, wherein the power device card has a plurality of leads including a first lead and a second lead and the plurality of semiconductor devices include a first semiconductor device, a second semiconductor device, and a third semiconductor device, wherein the first semiconductor device and the second semiconductor device are positioned on the first lead and the third semiconductor device is positioned on the second lead, wherein the first semiconductor device and the second semiconductor device are positioned adjacent to each other and widthwise along a width of the first lead proximal to a power input of a printed circuit board of the plurality of printed circuit boards to reduce loop inductance.

8. The electronics package of claim 7, wherein the power device card is received within the expansion slot without being soldered.

9. The electronics package of claim 7, wherein the power device card is removable from the expansion slot.

10. The electronics package of claim 7, wherein the plurality of printed circuit boards receive direct current (DC) power, and wherein the power semiconductor devices convert the DC power to alternative current (AC) to power a motor of a vehicle.

11. A modular electronics package, comprising: a main circuit having a first expansion slot and a second expansion slot, the main circuit being configured to provide electrical interconnections to form an electric circuit; a first power device card being configured to be inserted into the first expansion slot and to be electrically coupled to the main circuit via the first expansion slot; and a second power device card being configured to be inserted into the second expansion slot and to be electrically coupled to the main circuit via the second expansion slot, the second power device card being interchangeable with the first power device card, wherein the first power device card has a plurality of leads including a first lead and a second lead and a plurality of semiconductor devices including a first semiconductor device, a second semiconductor device, and a third semiconductor device, wherein the first semiconductor device and the second semiconductor device are positioned on the first lead and the third semiconductor device is positioned on the second lead, wherein the first semiconductor device and the second semiconductor device are positioned adjacent to each other and widthwise along a width of the first lead proximal to a power input to reduce loop inductance of the first electronics package.

12. The modular electronics package of claim 11, wherein the first power device card includes at least one of a printed circuit board (PCB) or a direct bonded copper substrate (DBC), wherein the at least one of the PCB or the DBC forms the electric circuit between a plurality of semiconductor devices.

13. The modular electronics package of claim 11, wherein the first power device card is received within the first expansion slot without being soldered and the first power device card is removable.

14. The modular electronics package of claim 11, wherein the first power device card includes a first semiconductor device and the second device card includes a second semiconductor device, wherein the first and second semiconductor devices convert the DC power to alternative current (AC) to power a motor of a vehicle.

* * * * *